US012591182B2

(12) United States Patent
Hsieh et al.

(10) Patent No.: US 12,591,182 B2
(45) Date of Patent: Mar. 31, 2026

(54) LITHOGRAPHY CONTAMINATION CONTROL

(71) Applicant: Taiwan Semiconductor Manufacturing Co., Ltd., Hsinchu (TW)

(72) Inventors: Chieh Hsieh, Hsinchu (TW); Tai-Yu Chen, Hsinchu (TW); Cho-Ying Lin, Hsinchu (TW); Heng-Hsin Liu, Hsinchu (TW); Li-Jui Chen, Hsinchu (TW); Shang-Chieh Chien, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/766,165

(22) Filed: Jul. 8, 2024

(65) Prior Publication Data

US 2024/0361708 A1     Oct. 31, 2024

Related U.S. Application Data

(63) Continuation of application No. 18/311,795, filed on May 3, 2023, now Pat. No. 12,055,867, which is a (Continued)

(51) Int. Cl.
*G03F 7/00*       (2006.01)
*H05G 2/00*       (2006.01)

(52) U.S. Cl.
CPC ...... *G03F 7/70925* (2013.01); *G03F 7/70033* (2013.01); *G03F 7/70808* (2013.01); *G03F 7/70916* (2013.01); *H05G 2/0094* (2024.08)

(58) Field of Classification Search
CPC ........... H05G 2/00–0094; H05G 2/008; H05G 2/005; G03F 7/70925; G03F 7/70033;
(Continued)

(56) References Cited

U.S. PATENT DOCUMENTS

| | | | |
|---|---|---|---|
| 11,662,668 B2 | 5/2023 | Hsieh et al. | |
| 2004/0075063 A1 | 4/2004 | Hasegawa et al. | |
| 2006/0243927 A1 | 11/2006 | Tran et al. | |
| 2007/0188721 A1 | 8/2007 | Hasegawa | |

(Continued)

FOREIGN PATENT DOCUMENTS

WO      2021/148224 A1      7/2021

*Primary Examiner* — Christina A Riddle
(74) *Attorney, Agent, or Firm* — Seed IP Law Group

(57)      ABSTRACT

A lithography system is provided capable of deterring contaminants, such as tin debris from entering into the scanner. The lithography system in accordance with various embodiments of the present disclosure includes a processor, an extreme ultraviolet light source, a scanner, and a hollow connection member. The light source includes a droplet generator for generating a droplet, a collector for reflecting extreme ultraviolet light into an intermediate focus point, and a light generator for generating pre-pulse light and main pulse light. The droplet generates the extreme ultraviolet light in response to the droplet being illuminated with the pre-pulse light and the main pulse light. The scanner includes a wafer stage. The hollow connection member includes an inlet that is in fluid communication with an exhaust pump. The hollow connection member provides a hollow space in which the intermediate focus point is disposed. The hollow connection member is disposed between the extreme ultraviolet light source and the scanner.

20 Claims, 8 Drawing Sheets

Related U.S. Application Data continuation of application No. 17/461,744, filed on Aug. 30, 2021, now Pat. No. 11,662,668.

(58) Field of Classification Search
CPC ............. G03F 7/70491; G03F 7/70808; G03F 7/70916; G03F 7/70091; G03F 7/708; G03F 7/70825; G03F 7/70833; G03F 7/70841; G03F 7/70858; G03F 7/70883; G03F 7/70891; G03F 7/70908–70941; G03F 7/70991; G03F 7/70483–70541; G03F 7/7095; G03F 7/70975; G03F 7/70983; G02B 17/0663
USPC ................ 355/30, 52–55, 67–77; 430/5, 30; 250/492.1–492.2, 493.1, 494.1, 503.1, 250/504 R, 505.1, 515.1, 517.1
See application file for complete search history.

(56) References Cited

U.S. PATENT DOCUMENTS

| | | | |
|---|---|---|---|
| 2008/0035865 | A1 | 2/2008 | Komori et al. |
| 2009/0073396 | A1 | 3/2009 | Gabriel Van De Vijver et al. |
| 2009/0154642 | A1 | 6/2009 | Bykanov et al. |
| 2010/0051827 | A1 | 3/2010 | Derra et al. |
| 2010/0288937 | A1* | 11/2010 | Watanabe ................ G21K 1/04 250/504 R |
| 2012/0327381 | A1 | 12/2012 | Labetski et al. |
| 2017/0094767 | A1* | 3/2017 | Ueda ...................... H05G 2/007 |
| 2018/0173117 | A1 | 6/2018 | Chien et al. |
| 2020/0057181 | A1* | 2/2020 | Yang ................... G03F 7/70916 |
| 2020/0089124 | A1* | 3/2020 | Labetski ............. G03F 7/70916 |
| 2020/0107427 | A1 | 4/2020 | Tu et al. |
| 2020/0312479 | A1 | 10/2020 | Ueda et al. |
| 2020/0314990 | A1* | 10/2020 | Chen ................... G03F 7/70916 |
| 2022/0082946 | A1* | 3/2022 | Lee ..................... G03F 7/70916 |

* cited by examiner

LITHOGRAPHY CONTAMINATION CONTROL

PRIORITY CLAIM AND CROSS-REFERENCE

This application is a continuation of U.S. patent application Ser. No. 18/311,795, filed May 3, 2023, which is a continuation of U.S. application Ser. No. 17/461,744, filed Aug. 30, 2021, which is hereby incorporated by reference in its entirety.

BACKGROUND

To produce semiconductor devices, a semiconductor substrate, such as a silicon wafer, which is a raw material for the semiconductor devices, must go through a sequence of complicated and precise process steps. Often, to complete the sequence, the wafer must be physically transported from one piece of fabrication equipment to another piece of fabrication equipment. Within these pieces of fabrication equipment, various processes such as diffusion, ion implantation, chemical vapor deposition, photolithography, etching, physical vapor deposition, and chemical mechanical polishing are carried out on the semiconductor substrate.

Photolithography, also called optical lithography or lithography, is a process used to transfer a sophisticated pattern of a photomask (e.g., mask) onto a photoresist coated surface of the substrate (e.g., wafer) using light. Subsequent processing includes etching that creates a permanent pattern of the photomask on the substrate.

In the modern photolithography process, a light source that generates extreme ultraviolet (EUV) light is used for transferring the highly sophisticated pattern onto the substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
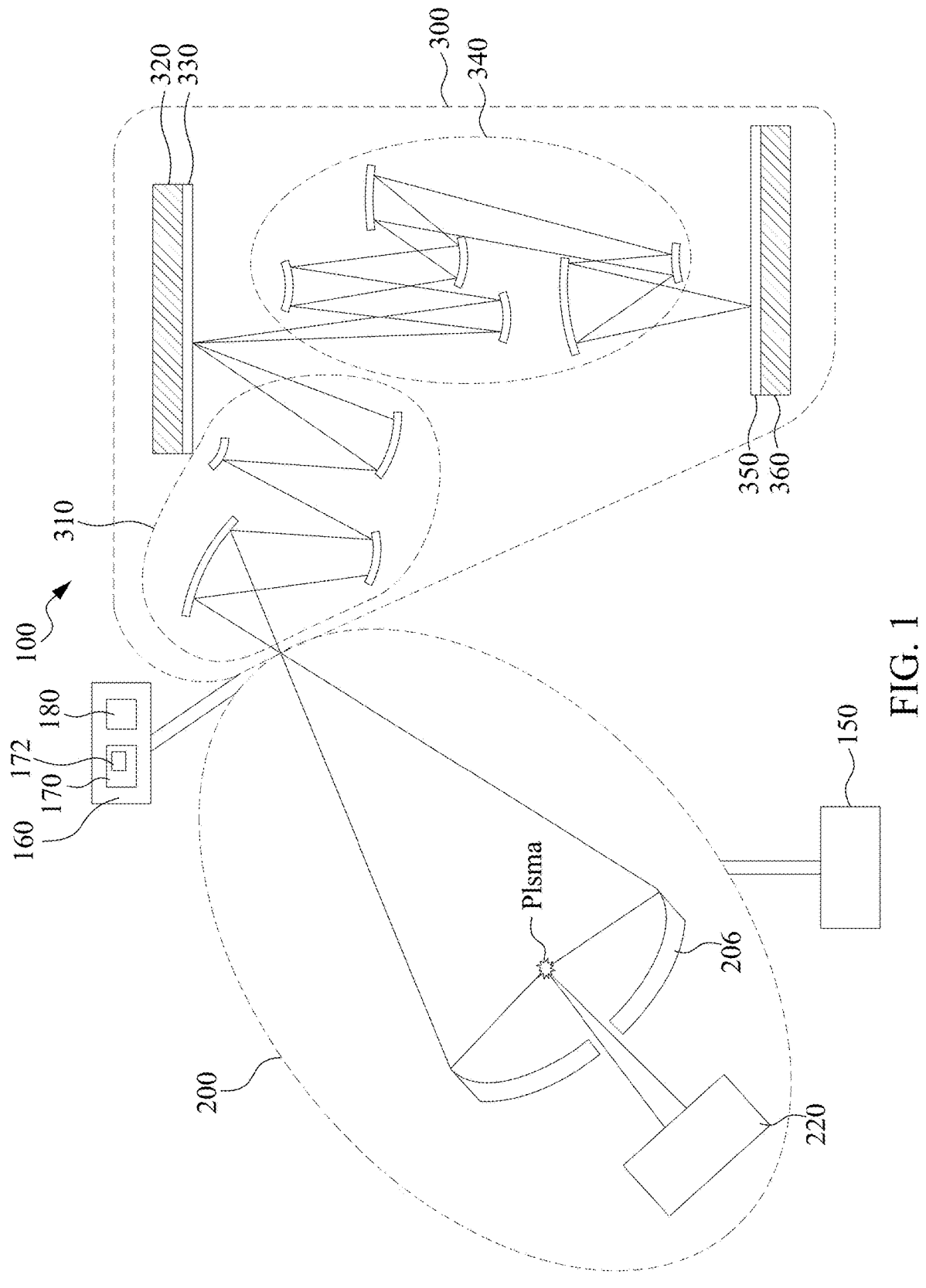
FIG. 1 is a schematic view of an extreme ultraviolet light lithography system configured with a contamination abatement module according to one or more embodiments of the present disclosure, which is configured to reduce the amount of contaminants that enter into a scanner of the extreme ultraviolet light lithography system.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An extreme ultraviolet light lithography system or tool includes a light source and a scanner for an exposure step in a semiconductor fabrication process. The light source generates extreme ultraviolet light and includes a condenser lens and mirror (e.g., collector) to reflect and focus the generated extreme ultraviolet light into the intermediate focus point. The focused extreme ultraviolet light is provided to the scanner for the exposure step. The scanner of the extreme ultraviolet light lithography system includes an illuminator, a photomask stage (e.g., reticle stage), which is configured to hold a photomask (e.g., mask), projection optics, and a substrate table (e.g., wafer stage). The extreme ultraviolet light travels from the light source portion of the extreme ultraviolet light lithography system to the scanner portion of the extreme ultraviolet light lithography system via a hollow connection member.

Intense extreme ultraviolet light (EUV light) from the light source travels through the condenser lens, the illuminator, the photomask stage, and the projection lens. In the exposure step, the light from the light source is directed onto a photoresist coated substrate (e.g., wafer) on the substrate table, after passing the condenser lens, the illuminator, the photomask stage, and the projection optics. By exposing the substrate to the intense light, a sophisticated pattern from the photomask (mask) is transferred onto the substrate.

To generate the intense light (e.g., EUV light) that is suitable for transferring the sophisticated pattern of the photomask (e.g., template or mask for <5 nm fabrication process) onto the photoresist coated surface of the substrate (e.g., wafer) consistently, a high energy light (e.g., carbon dioxide laser and excimer laser) is illuminated to a very small droplet (e.g., a droplet having a 30 μm diameter) that includes tin (Sn) in the source vessel of the light source. Since tin is an efficient generator of the EUV light, the high energy light illuminated to the droplet made of tin causes tin (Sn) excitation. In some embodiments, the droplet includes pure tin (Sn), tin compounds (e.g., $SnBr_4$, $SnBr_2$, and $SnH_4$), tin-alloys (e.g., tin-gallium alloys, tin-indium alloys, and tin-indium-gallium alloys), or combinations thereof.

The tin excitation generates an extremely hot plasma which produces a significant amount of the high intensity EUV light (e.g., light having a center wavelength at about 13.5 nm). In order to use the EUV light in the subsequent exposure step, the EUV light is collected by a collector (e.g., a curved reflective surface with a multi-layer coating) that is configured to reflect the EUV light from the plasma selectively into the intermediate focus point.

To maximize or increase the amount of the EUV light reflected and focused into the intermediate focus point, it is beneficial to have the reflective surface of the collector clean from the contaminants, such as tin droplet debris (or fragments) produced during the tin droplet excitation process. To clean or remove the tin debris deposited on the curved reflective surface (hereinafter "collector surface"), a flow of hydrogen gas ($H_2$) is introduced into the source vessel of the light source to etch the tin droplet debris deposited on the collector surface. As a result of a chemical reaction between the hydrogen gas ($H_2$) and the tin (Sn) droplet debris deposited on the collector surface, the hydrogen gas ($H_2$) and the tin (Sn) droplet debris are converted into a volatile tin compound, tin hydride ($SnH_4$). By introducing suitable purge gas (e.g., hydrogen gas and nitrogen gas) into the source vessel, the tin hydride ($SnH_4$) can be removed from the source vessel via a purge outlet.

To minimize or decrease the likelihood of the contaminants (e.g., tin debris) produced during the tin excitation process traveling to and depositing on the collector surface, a wafer in the process, and other components of the extreme ultraviolet light lithography system (e.g., illuminator, photomask stage, photomask, reticle, projection optics, and substrate stage), the flow of hydrogen gas ($H_2$) is introduced into the source vessel of the light source that keeps the tin debris flowing away (e.g., circulating) from the inner sidewall of the source vessel of the light source and the collector surface. Additionally, the flow of hydrogen gas (hereinafter "air curtain" or "gas curtain") reduces the likelihood of the contaminants (e.g., tin debris) flowing into the scanner of the extreme ultraviolet light lithography system by deterring or blocking the flow of the tin debris.

As discussed above, the hydrogen gas ($H_2$) that is introduced into the lithography system keeps the collector surface in the light source and components in the scanner less contaminated with the tin debris. Particularly, the flow of hydrogen gas ($H_2$) is arranged to block or deter the flow of the tin debris into the scanner. However, the more hydrogen gas ($H_2$) introduced into the lithography system (e.g., light source) to deter the flow of the tin debris into the scanner, the more likely the hydrogen gas will reduce the intensity of the EUV light generated by the light source. A reduction in intensity of the EUV light can adversely impact the performance of the EUV lithography system.

Embodiments in accordance with subject matter described herein include a smart contamination abatement module that is configured to remove the contaminants (particularly, tin debris produced during the tin excitation process) flowing into the scanner and/or is configured to alter the flowing direction of the tin debris before contaminating the various components located in the scanner of the extreme ultraviolet light lithography system (e.g., an illuminator, a photomask stage, photomask, reticle, projection optics, and a substrate table). As discussed above, by circulating the hydrogen gas ($H_2$) within the source vessel, the tin debris, created during the tin excitation process, continuously flows within the source vessel without being deposited on the inner surface of the source vessel. Eventually, most of the tin debris circulated by the air curtain is collected and removed from the source vessel. However, a small portion of tin debris, created during the tin excitation process, which has a high velocity, is not controllable or manageable with the air curtain. The tin debris that is not controllable with the air curtain due to the high velocity may flow into the scanner portion of the extreme ultraviolet light lithography system. Since the scanner is operated under a high vacuum (due to less hydrogen gas in the scanner), the uncontrollable tin debris can be easily sucked into the scanner and contaminate various components in the scanner once the debris passes through the air curtain in the light source. In accordance with various embodiments of the present disclosure, by reducing the amount of contaminants such as the tin debris entering into the scanner, a process yield from the extreme ultraviolet light lithography system is maintained or improved.

The contamination abatement module according to one or more embodiments disclosed in the present disclosure is also able to extend the cleaning interval (e.g., preventive maintenance interval) of various components in the scanner. That will reduce significant "tool down time" for the preventive maintenance, which will improve production rates.

The contamination abatement module according to one or more embodiments disclosed in the present disclosure is also able to improve or to maintain the intensity of the extreme ultraviolet light provided to the scanner portion of the extreme ultraviolet light lithography system by reducing or minimizing the use of the air curtain (i.e., hydrogen gas ($H_2$) flow). Maintaining the intensity of the extreme ultraviolet light will maintain the quality of the patterns formed in the photoresist on the wafer be processed.

FIG. 1 is a schematic view of an extreme ultraviolet light lithography system 100 configured with a contamination abatement module 160 according to one or more embodiments of the present disclosure, which is configured to reduce contaminants entering into a scanner 300 of the extreme ultraviolet light lithography system 100. As noted above, such contaminants may be caused by the tin excitation process that occurs at a light source 200 according to one or more embodiments of the present disclosure.

Referring to FIG. 1, the extreme ultraviolet light lithography system 100 includes the light source 200 configured to generate extreme ultraviolet (EUV) light and a scanner 300 that is operable to perform a lithography exposing processes using the EUV light from the light source 200. In the present embodiment, the scanner 300 of the extreme ultraviolet light lithography system 100 exposes a photoresist layer (e.g., coated layer) on a substrate 350 (e.g., semiconductor wafer) to the EUV light. The photoresist layer is a material sensitive to the EUV light. Extreme ultraviolet light lithography system 100 employs the light source 200 to generate the EUV light (with a wavelength ranging between about 1 nm and about 100 nm). In one particular example, the light source 200 generates the EUV light with a wavelength centered at about 13.5 nm. In the present embodiment, the light source 200 utilizes a mechanism of laser-produced plasma (LPP) to generate the EUV light, which will be further described later.

Extreme ultraviolet light lithography system 100 employs an illuminator 310. In some embodiments, the illuminator 310 includes various refractive optic components, such as a single lens or a lens system having multiple lenses (zone plates). In some embodiments, the illuminator 310 includes alternatively reflective optics, such as a single mirror or a mirror system having multiple mirrors in order to direct the EUV light from the light source 200 onto a photomask stage 320, particularly to a mask 330 secured on the photomask stage 320 as illustrated in FIG. 1.

As discussed above, the extreme ultraviolet light lithography system 100 includes the photomask stage 320 configured to secure the mask 330. In some embodiments, the photomask stage 320 includes an electrostatic chuck (e-chuck) to secure the mask 330. Due to the ability of gas molecules, e.g., hydrogen gas molecules or ions, to absorb EUV light, a lithography system for the EUV lithography patterning is maintained in a vacuum environment to avoid the EUV intensity loss. In the current description, the terms of mask and photomask are used to refer to the same item. Often mask is associated with a reticle in the photomask stage 320. In the present embodiment, the mask 330 is a reflective mask. One exemplary structure of the mask 330 is provided for illustration. Mask 330 includes a substrate with a suitable material, such as a low thermal expansion material (LTEM) or fused quartz. In various examples, the LTEM includes TiO2 doped SiO2, or other suitable materials with low thermal expansion. Mask 330 includes multiple reflective multiple layers (ML) deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light. Mask 330 may further include a capping layer, such as ruthenium (Ru), disposed on the ML for protection. Mask 330 further includes an absorption layer, such as a tantalum boron nitride (TaBN) layer, deposited over the ML. The absorption layer is patterned to define a layer of an integrated circuit (IC). Alternatively, another reflective layer may be deposited over the ML and is patterned to define a layer of an integrated circuit, thereby forming an EUV phase shift mask.

Extreme ultraviolet light lithography system 100 also includes projection optics 340 for imaging the pattern of the mask 330 onto a substrate 350 (e.g., semiconductor wafer) secured on a substrate table 360 of the extreme ultraviolet light lithography system 100. In some embodiments, the projection optics 340 have refractive optics. In some embodiments, the projection optics 340 include alternatively reflective optics as illustrated in FIG. 1. The light directed from the mask 330, carrying the image of the pattern defined on the mask 330, is collected by the projection optics 340. Illuminator 310 and the projection optics 340 are collectively referred to an optical module of the extreme ultraviolet light lithography system 100.

Extreme ultraviolet light lithography system 100 includes the substrate table 360 to secure the substrate 350. In the present embodiment, the substrate 350 is a semiconductor wafer, such as a silicon wafer or other type of wafer to be patterned (e.g., SiC). Substrate 350 is coated with the photoresist layer sensitive to the radiation beam, such as EUV light, in the present embodiment. Various components including those described above are integrated together and are operable to perform lithography exposing processes.

Extreme ultraviolet light lithography system 100 may further include other modules or be integrated with (or be coupled with) other modules. In various embodiments, the extreme ultraviolet light lithography system 100 includes a gas supply module 150 designed to provide the hydrogen gas ($H_2$) to the light source 200 for the purposes discussed above (e.g., cleaning and circulating the tin debris for removal). In various embodiments, the extreme ultraviolet light lithography system 100 includes the contamination abatement module 160. In some embodiments, the contamination abatement module 160 includes an exhaust pump 170 (e.g., vacuum pump) designed to remove air or gas (including hydrogen gas) and contaminants (e.g., tin debris) from the extreme ultraviolet light lithography system 100 (e.g., the light source 200, the scanner 300, and a hollow connection member (232 in FIG. 2) which will be described later in the disclosure). Exhaust pump 170 can be a pump that is suitable to remove gas molecules (e.g., hydrogen gas) from the extreme ultraviolet light lithography system 100. In some embodiments, the exhaust pump 170 includes a roughing pump. In some embodiments, the exhaust pump 170 includes a turbomolecular high vacuum pump. In some embodiments, the exhaust pump 170 includes an entrapment pump (e.g., cryopump). In some embodiments, the exhaust pump 170 includes a combination of different types of pumps such as the roughing pump and the turbomolecular high vacuum pump. In some embodiments, the contamination abatement module 160 includes a magnet member 182 (shown as A-H in FIGS. 5 and 6) and a magnet member driver 180 which will be described later in the disclosure.

Figure 2:
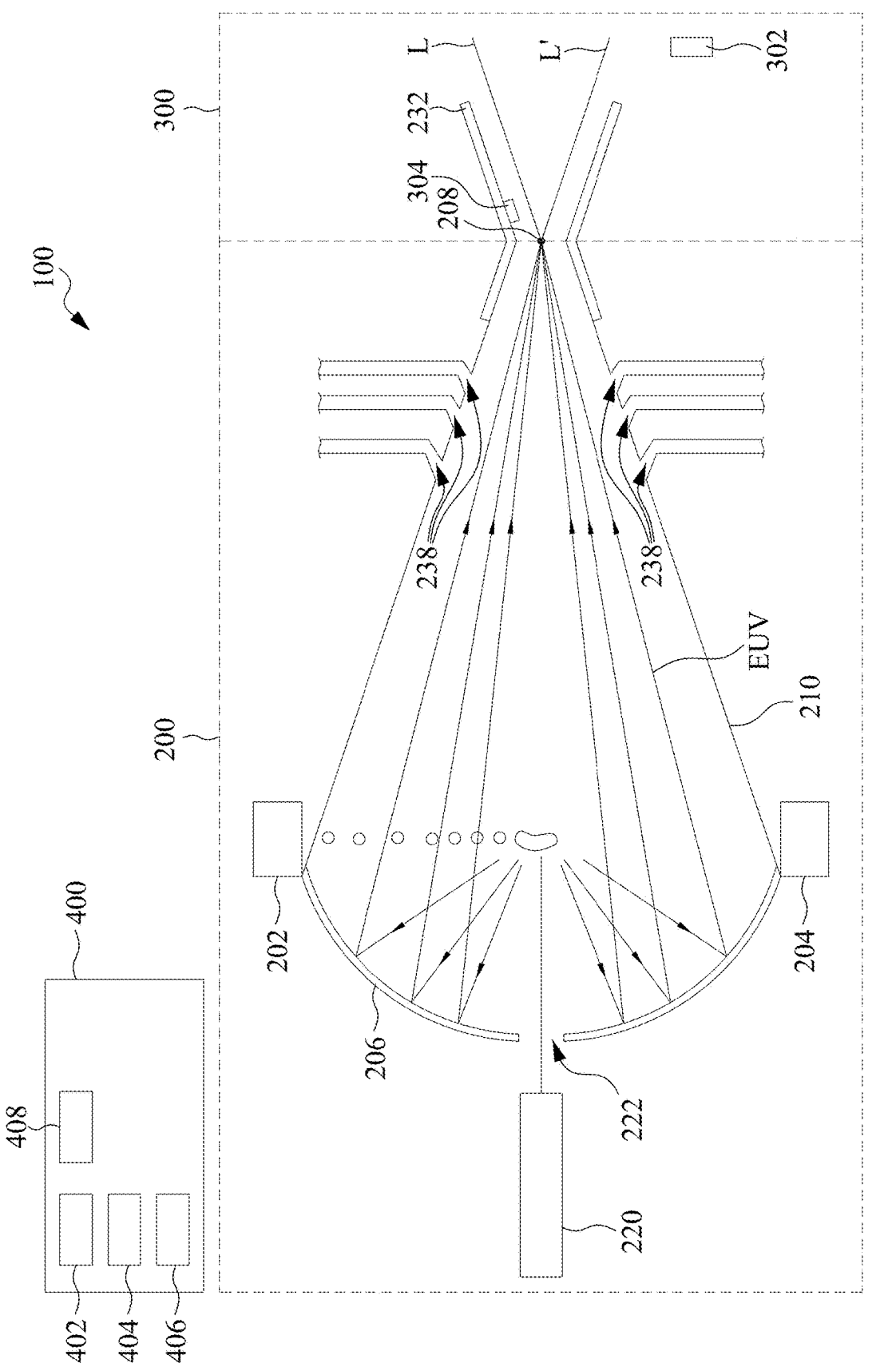
FIG. 2 is a schematic cross-sectional view of the extreme ultraviolet light source connected to a scanner of the extreme ultraviolet light lithography system according to one or more embodiments of the present disclosure.

FIG. 2 is a schematic cross-sectional view of the extreme ultraviolet light source 200 connected to the scanner 300 of the extreme ultraviolet light lithography system 100 according to one or more embodiments of the present disclosure.

Referring to FIG. 2, the extreme ultraviolet light lithography system 100 includes the light source 200 and the scanner 300 (shown in FIG. 1 and partially shown in FIG. 2), and a hollow connection member 232 between the light source 200 and the scanner 300. Hollow connection member 232 provides a passage for the EUV light generated at the light source 200 so the EUV light can be provided to the scanner 300. In other words, via the hollow connection member 232, the light source 200 supplies the EUV light to the scanner 300 for the exposure step. In the present embodiment, the hollow connection member 232 includes a structure of the light source 200 (adjacent to an intermediate focus point 208) that is being used to couple to the scanner 300 and a structure of the scanner 300 (adjacent to the intermediate focus point 208) that is being used to couple to the light source 200. Light source 200 includes a droplet generator 202 for generating droplets (e.g., tin (Sn) droplets)

into a source vessel 210, a droplet catcher 204 for collecting unused or unirradiated droplets from the droplet generator 202, a collector 206 shaped to reflect the EUV light generated from tin (Sn) excitation selectively into the intermediate focus point 208, a light generator 220 (e.g., carbon dioxide pulse laser generator and excimer laser generator) for generating pre-pulse light and main pulse light, an aperture 222 (e.g., opening) on the collector 206 that allows the pre-pulse light and the main pulse light to illuminate the droplets in the source vessel 210, hydrogen gas (H₂) outlets 238 (connected to the gas supply module 150) for generating the gas curtain within the source vessel 210, and a controller 400 for controlling the gas supply module 150, the contamination abatement module 160, and various other components of the light source 200 including the droplet generator 202, the droplet catcher 204, and the light generator 220. Controller 400 controls these modules and components to minimize or reduce the likelihood of the contaminants (e.g., tin debris) entering into the scanner 300 via the hollow connection member 232. As will be described later in this disclosure, the exhaust pump 170 and the magnet member driver 180 in the contamination abatement module 160 are configured to reduce the contaminants from entering into the scanner 300 where they may adversely impact the lithography process.

In accordance with one or more embodiments of the present disclosure, the controller 400 includes an input circuitry 402, a memory 404, a processor 406, and an output circuitry 408. Controller 400 includes the (computer) processor 406 configured to perform the various functions and operations described herein including receiving input data from various data sources (e.g., vacuum pressure data from the scanner 300) via the input circuitry 402 and transmitting output data (e.g., contamination abatement module control signal for the contamination abatement module 160) via the output circuitry 408. Memory 404 stores the vacuum pressure data received via the input circuitry 402. Memory 404 may be or include any computer-readable storage medium, including, for example, read-only memory (ROM), random access memory (RAM), flash memory, hard disk drive, optical storage device, magnetic storage device, electrically erasable programmable read-only memory (EEPROM), organic storage media, or the like.

In accordance with various embodiments, the light generator 220 (e.g., carbon dioxide pulse laser generator and excimer laser generator) generates a train of light pulses including pre-pulse light and main pulse light, and the light generated by the light generator 220 illuminates the tin droplet traveling in the source vessel 210. The illumination of the tin droplets creates the tin excitation which generates the plasma that emits the EUV light. To increase or maximize the amount of the plasma generated from the tin excitation with the main pulse light, the pre-pulse light illuminates the tin droplet before the tin droplet is illuminated with the main pulse light. The tin droplet irradiated with the pre-pulse light expands its diameter. When the diameter of the expanded tin droplet (hereinafter "pancake") matches with the beam size of the main pulse light and the pancake is substantially overlapped with the beam of the main pulse light in the source vessel 210, there is a higher chance of producing more plasma from the tin excitation with the main pulse light. During the tin excitation process, the contaminants such as tin debris or fragments are generated.

Figures 3, 4:
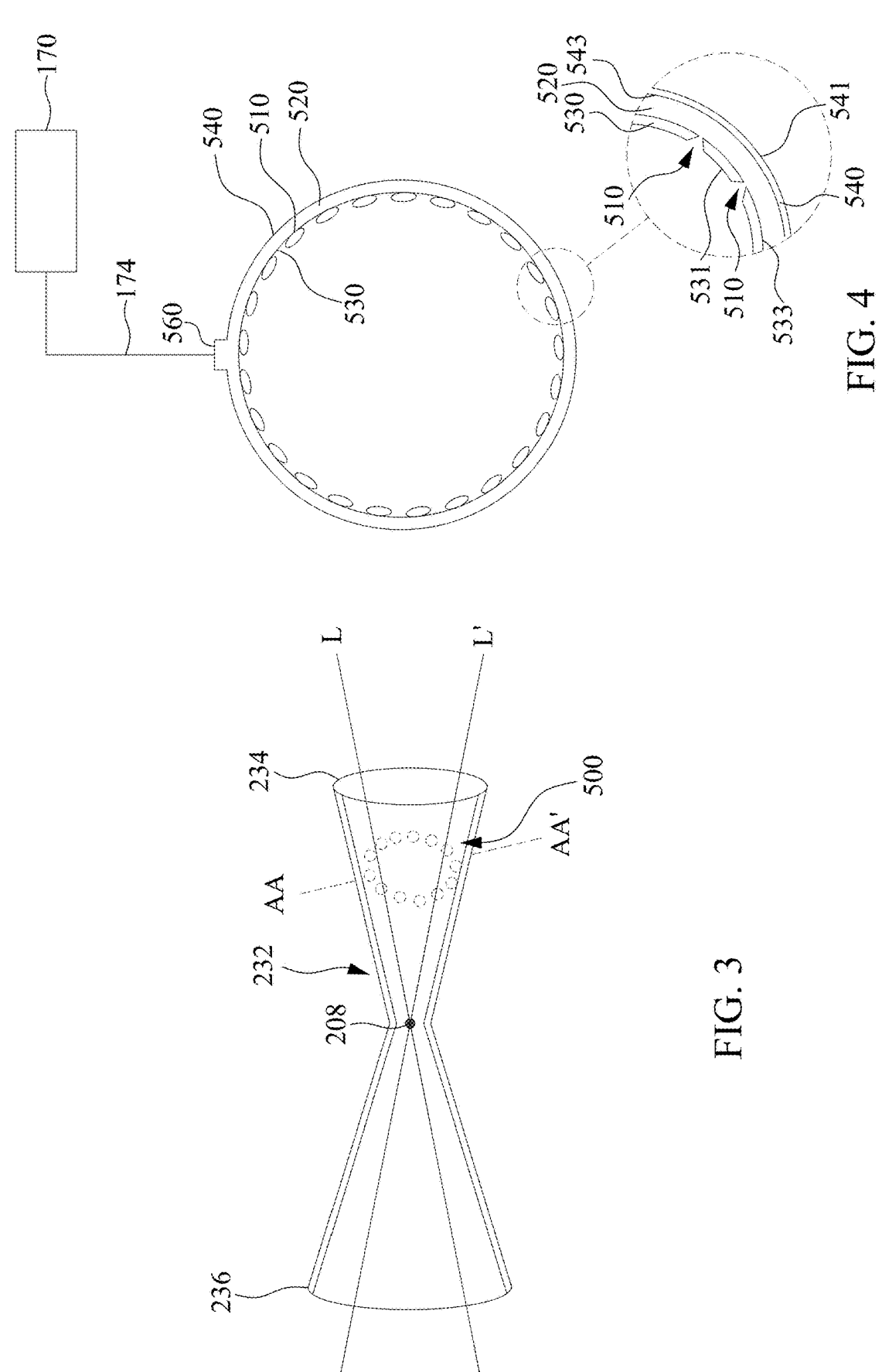
FIG. 3 is a schematic view of a hollow connection member (configured with an inlet of an exhaust pump) which provides a passage of an extreme ultraviolet light generated from the extreme ultraviolet light source to the scanner according to one or more embodiments of the present disclosure.
FIG. 4 is a cross-sectional view of the hollow connection member configured with an inlet that includes a plurality of suction openings according to one or more embodiments of the present disclosure.

FIG. 3 is a schematic view of a hollow connection member 232 (configured with an inlet 500 which is in fluid communication with the exhaust pump 170) which provides a passage for an extreme ultraviolet light generated from the extreme ultraviolet light source 200 to the scanner 300 according to one or more embodiments of the present disclosure. FIG. 4 is a cross-sectional view (A-A' in FIG. 3) of the hollow connection member 232 configured with the inlet 500 that includes a plurality of suction openings 510 according to one or more embodiments of the present disclosure.

Referring to FIG. 3 and FIG. 4, the hollow connection member 232 includes the inlet 500 which includes a plurality of suction openings 510 (e.g., inlet openings through which gas within the hollow connection member 232 can pass) and a gas channel 520 for receiving gas that passes through the suction openings 510. The gas channel 520 collects the gas that has passed through the suction openings 510. In the embodiment of FIGS. 3 and 4, the suction openings 510 and the gas channel 520 are integrated into the hollow connection member 232. As illustrated in the exploded portion of FIG. 4, the gas channel 520 forms a plenum on an outer surface 533 of the hollow connection member 232. In the embodiment illustrated in FIG. 4, the gas channel 520 is between an inner wall 530 of the hollow connection member 232 and an outer wall 540 of the hollow connection member 232. Inner wall 530 includes an inner surface 531 and the outer surface 533. Outer wall 540 includes an outer surface 541 and an inner surface 543. In some embodiments, the one or more suction openings 510 of the inlet 500 pass through the inner wall 530. In the embodiment of FIG. 4, the outer wall 540 includes a coupling member 560 that connects the gas channel 520 to a gas line 174. Gas line 174 is coupled to the exhaust pump 170 as illustrated in FIG. 4.

Exhaust pump 170 is configured to flow gas to or remove gas from the hollow space in the hollow connection member 232. In some embodiments, the exhaust pump 170 is configured to flow gas to or remove gas from the hollow space in the hollow connection member 232 via the gas line 174, the coupling member 560, the gas channel 520, and the suction openings 510 of the inlet 500 as illustrated in FIG. 3 and FIG. 4. Exhaust pump 170 removes gas from the hollow space in the hollow connection member 232 by producing a pressure differential between exhaust pump 170 and the hollow space. As illustrated in FIG. 3 and FIG. 4, the inlet 500 includes the plurality of suction openings 510 (e.g., inlet openings) arranged within the hollow connection member 232. In the embodiment illustrated in FIG. 3 and FIG. 4, the suction openings 510, which are in fluid communication with the exhaust pump 170, are arranged through the inner wall 530 of the hollow connection member 232 between the intermediate focus point 208 and a first side 234 of the hollow connection member 232 that is adjacent to the scanner 300. In this example, the flowing pattern of the gas in the hollow connection member 232 can be changed by drawing gas from within the hollow space of the connection member 232 into the gas channel 520 at a location between the intermediate focus point 208 and the first side 234 of hollow connection member 232. When the gas is drawn from within the hollow space, some of the contaminants (e.g., tin debris) passing through the hollow space of the hollow connection member 232 are influenced by the gas flow pattern (e.g., fluid dynamics) created at the suction openings 510 and are diverted to an inner surface of the walls of the chamber of the scanner 300 rather than towards surfaces of components in the scanner 300 (e.g., the illuminator, the photomask stage, the projection optics, and the substrate table). Some of the contaminants can also be removed from the extreme ultraviolet light lithography system 100 via the suction openings 510.

In some embodiments, the suction openings 510 of the inlet 500 are arranged through the inner wall 530 of the hollow connection member 232 between the intermediate focus point 208 and a second side 236 of the hollow connection member 232 that is adjacent to the light source 200. In other embodiments, the suction openings 510 of the inlet 500 are arranged through the inner wall 530 of the hollow connection member 232 surrounding the intermediate focus point 208. In other words, the suction openings 510 can be arranged through the inner wall 530 of the hollow connection member 232 between the first side 234 of the hollow connection member 232 and the intermediate focus point 208, between the second side 236 of the hollow connection member 232 and the intermediate focus point 208 or through the inner wall 530 of the hollow connection member 232 around the intermediate focus point 208.

In various embodiments of the present disclosure, the vacuum pressure data of the scanner 300 is collected (e.g., measured and recorded) and transmitted to the controller 400 by the vacuum pressure gauge 302 located at the scanner 300, and the vacuum pressure data of the hollow space of the hollow connection member 232 is collected and transmitted to the controller 400 by the vacuum pressure gauge 304 located at the hollow connection member 232. In accordance with the vacuum pressure data from the vacuum pressure gauges 302 and 304, the controller 400 determines the operation speed of the exhaust pump 170 that provides a desired gas volume flow rate at the inlet 500 and adjusts the operation speed of the exhaust pump 170 to provide the desired gas volume flow rate. Controller 400 adjusts the operation speed of the exhaust pump 170 by transmitting a contamination abatement module control signal (e.g., exhaust pump control signal) to the exhaust pump controller 172 of the contamination abatement module 160. In some embodiments, the contamination abatement module control signal causes the exhaust pump to operate at a speed that causes the hollow space of the hollow connection member 232 to be maintained under a higher vacuum condition (e.g., higher negative pressure) than the vacuum condition of the scanner 300. In other embodiments, the exhaust pump is operated at a speed that causes the hollow space of the hollow connection member 232 to be maintained under a lower pressure (but not necessarily a vacuum pressure) than the pressure within the scanner 300.

In various embodiments, the controller 400 is configured to generate the contamination abatement module control signal (e.g., exhaust pump control signal) based on the vacuum pressure data of the scanner 300 and the pressure data of the hollow space of the hollow connection member 232 to keep the hollow space under the higher vacuum condition (e.g., higher negative pressure or less air or hydrogen gas) than the vacuum condition of the scanner 300. In some embodiments, the controller 400 transmits the contamination abatement module control signal (e.g., exhaust pump control signal) based on the vacuum pressure data of the scanner 300 and the hollow space to maintain the hollow space under the higher vacuum condition than the vacuum condition in the scanner 300 by a predetermined pressure difference (e.g., 2 Pa). In some embodiments, the controller 400 is configured to vary the predetermined pressure difference (e.g., setting the predetermined pressure difference from the 2 Pa to 1 Pa and back to 2 Pa) to create variation in the gas flow pattern in the hollow space. The random variation (and/or the periodic variation) in the flow pattern provides variation in the flow pattern that increases the likelihood of diverting the contaminants to the inner surface of the walls of the chamber of the scanner 300 rather than towards surfaces of the components in the scanner 300 (e.g., the illuminator, the photomask stage, the projection optics, and the substrate table).

Referring to FIG. 4, in some embodiments of the present disclosure, the hollow connection member 232 is configured with the inlet 500 that includes a plurality of suction openings 510 with different sizes to create the variation in the gas flow pattern in the hollow space. As shown in FIG. 4, the inlet 500 includes the suction openings 510 with different sizes and/or shapes. The variation with the different shapes and/or sizes (e.g., different diameters, different cross-sectional areas and different opening (nozzle) directions) provides variation in the gas flow pattern that increases the likelihood of diverting the contaminants to the inner surface of the walls of the chamber of the scanner 300 rather than towards surfaces of the components in the scanner 300 (e.g., the illuminator, the photomask stage, the projection optics, and the substrate table). Embodiments in accordance with the present disclosure are not limited to an inlet 500 that includes suction opening 510 with different sizes and/or shapes. In some embodiments, the inlet 500 includes suction openings 510 of the same size and/or the same shape.

Figure 6:
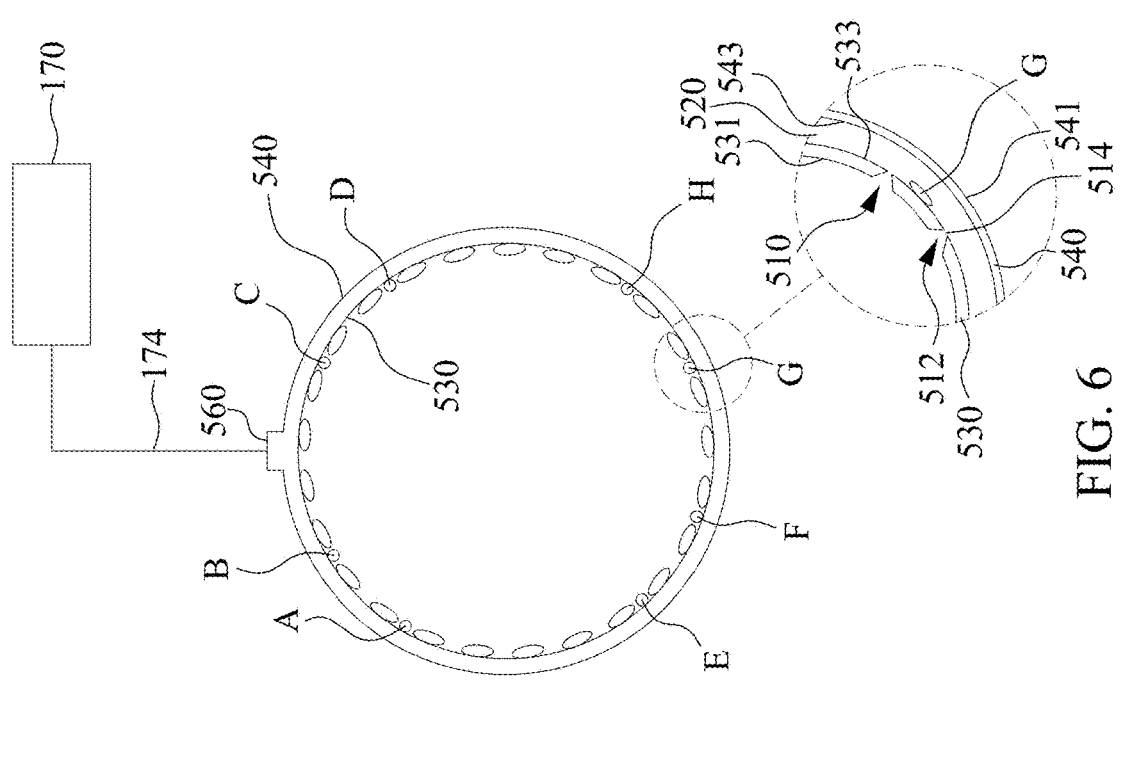
FIG. 6 is a cross-sectional view of the hollow connection member illustrated in FIG. 5 according to one or more embodiments of the present disclosure.
Figure 5:
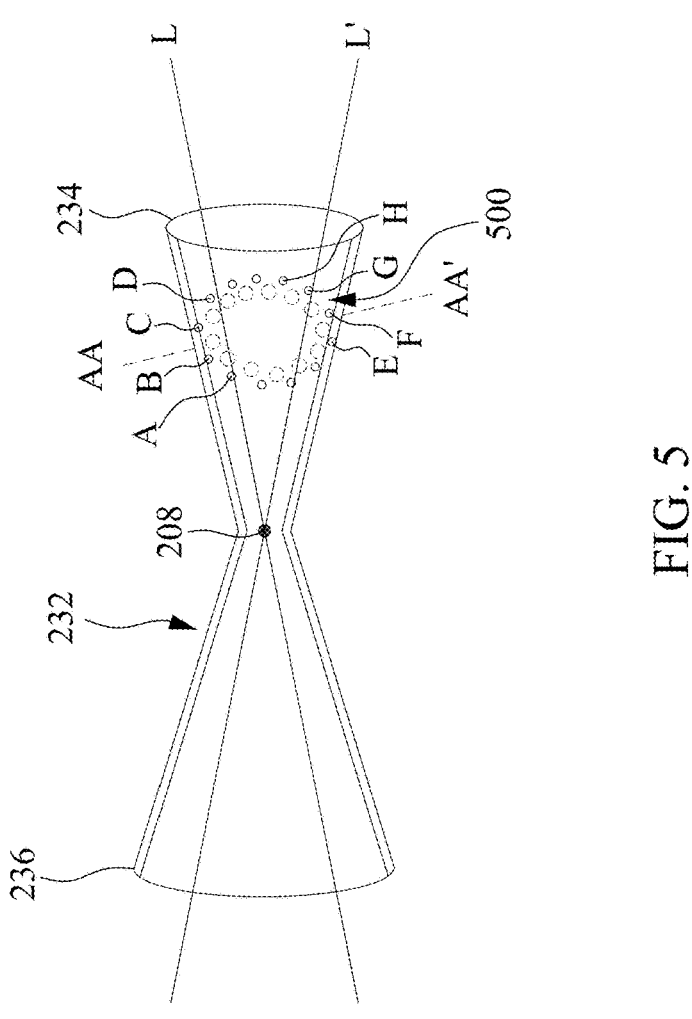
FIG. 5 is a schematic view of a hollow connection member configured with the inlet of the exhaust pump and a magnet member according to one or more embodiments of the present disclosure.

FIG. 5 is a schematic view of another embodiment of the hollow connection member 232 configured with the inlet 500 and a magnet member 182 (shown as individual magnets A-H in FIGS. 5 and 6) according to one or more embodiments of the present disclosure. FIG. 6 is a cross-sectional view (AA-AA' in FIG. 5) of the hollow connection member 232 illustrated in FIG. 5 according to one or more embodiments of the present disclosure.

Referring to FIG. 5 and FIG. 6, the inlet 500, including the suction openings 510 (e.g., inlet openings in fluid communication with the exhaust pump 170) and the gas channel 520 in fluid communication with the suction openings 510 and the exhaust pump 170, is integrated with the hollow connection member 232. The hollow connection member 232 illustrated in FIGS. 5 and 6 is similar to the hollow connection member 232 of FIG. 4. The description of hollow connection member 232 presented in the context of FIG. 4 is equally applicable to the hollow connection member 232 illustrated in FIGS. 5 and 6. In addition, the description of the exhaust pump 170, gas line 174, coupling member 560, gas channel 520, outer wall 540, inner wall 530, inner surface 531, outer surface 533, inner surface 541 and outer surface 543 above with reference to FIGS. 3 and 4 is applicable to the features in FIGS. 5 and 6 identified by the same reference numbers. Accordingly, the description of these features need not be reproduced.

In the embodiment illustrated in FIGS. 5 and 6, the hollow connection member 232 includes magnet member 182 (shown as individual magnets A-H in FIGS. 5 and 6). A function of magnet member 182 is to create a magnetic field to attract the contaminants (e.g., tin debris) into the suction openings 510 or into the vicinity of suction openings 510 where the gas flow can transport the contaminants out of the hollow connection member 232. Some of the contaminants that are attracted to or influenced by the magnetic field but are not removed from the hollow connection number 232 and thus remain in the extreme ultraviolet light lithography system 100 (e.g., the hollow connection member 232 and scanner 300) are at least diverted toward the inner surface of the walls of the chamber of the scanner 300 rather than traveling toward surfaces of the components in the scanner 300 (e.g., the illuminator, the photomask stage, the projection optics, and the substrate table). As illustrated in FIG. 5 and FIG. 6, in some embodiments, to increase the likelihood of having more tin debris or other contaminants pass through suction openings 510, each of the suction openings 510 has a cone shaped opening, that is larger (e.g., wider) at inner surface 531 of inner wall 530 and smaller (e.g., narrower) at outer surface 533 of inner wall 530. As illustrated in FIG. 6, in some embodiments, each of the suction openings 510 has a first opening 512 at inner surface 531 of inner wall 530 of the hollow connection member 232 and a second opening 514 at outer surface 533 of inner wall 530. As shown in FIG. 6, a diameter of the first opening 512 is greater than a diameter of the second opening 514. As illustrated in FIG. 5 and FIG. 6, in some embodiments, the magnet member 182 is located at a respective space between adjacent suction openings 510. In some embodiments, the magnet member 182 is disposed between the intermediate focus point 208 and the first side 234 of the hollow connection member 232 that is adjacent to the scanner 300. In some embodiments, the magnet member 182 is disposed between the intermediate focus point 208 and the second side 236 of the hollow connection member 232 that is adjacent to the light source 200. In some embodiments, the magnet member 182 surrounds the intermediate focus point 208. Magnet member 182 can be a permanent magnet, an electromagnet, or a permanent magnet and an electromagnet. The strength of magnet member 182 is chosen such that the magnetic field generated by magnet member 182 is sufficient to deflect contaminants that are passing through the magnetic field of magnetic member 182.

In various embodiments of FIGS. 5 and 6, the controller 400 is configured to transmit a contamination abatement module control signal (e.g., electromagnet control signal) to the magnet member driver 180 to create variation in the magnetic field in the hollow space of the hollow connection member 232. The variation in the magnetic field increases the likelihood of diverting the contaminants to the inner surface of the walls of the chamber of the scanner 300 rather than allowing the contaminants to travel in the direction of components in the scanner 300 (e.g., the illuminator, the photomask stage, the projection optics, and the substrate table). For example, the controller 400 is configured to generate an electromagnet control signal to alternately turn on (e.g., apply current to) a first group of electromagnets (A, B, C, D) of the magnet member 182 on an upper portion of the hollow connection member 232 and a second group of electromagnets (E, F, G, H) of the magnet member 182 on a lower portion of the hollow connection member 232. By doing so, the variation in the magnetic field increases the likelihood of diverting the contaminants to the inner surface of a wall of the chamber of the scanner 300 rather than allowing the contaminants to travel towards and contact components in the scanner 300 (e.g., the illuminator, the photomask stage, the projection optics, and the substrate table). Embodiments in accordance with the present disclosure are not limited to applying current to only a first group comprising electromagnets (A, B, C, D) and a second group of electromagnets (E, F, G, H). In other words, embodiments in accordance with the present disclosure include applying current to combinations of electromagnets other than the first group and the second group described above. For example, current could be applied to every other electromagnet or groupings of electromagnets that include less than four electromagnets.

In some embodiments, the controller 400 is configured to transmit the electromagnet control signal to the magnet member driver 180 which causes the magnet member driver 180 to apply different current to different electromagnets to create variation in the magnetic field in the hollow space of the hollow connection member 232. In other embodiments, the controller 400 is configured to transmit electromagnet control signals to the magnet member driver 180 which cause the magnet member driver 180 to apply current to some or all of the electromagnets for a predetermined period of time, remove current to some or all of the electromagnets for a predetermined trade of time and then repeat the cycle.

In some embodiments of the present disclosure, the magnet member 182 includes a plurality of permanent magnets with different magnetic powers to create variation in the magnetic field in the hollow space of the hollow connection member 232.

Figures 7, 8:
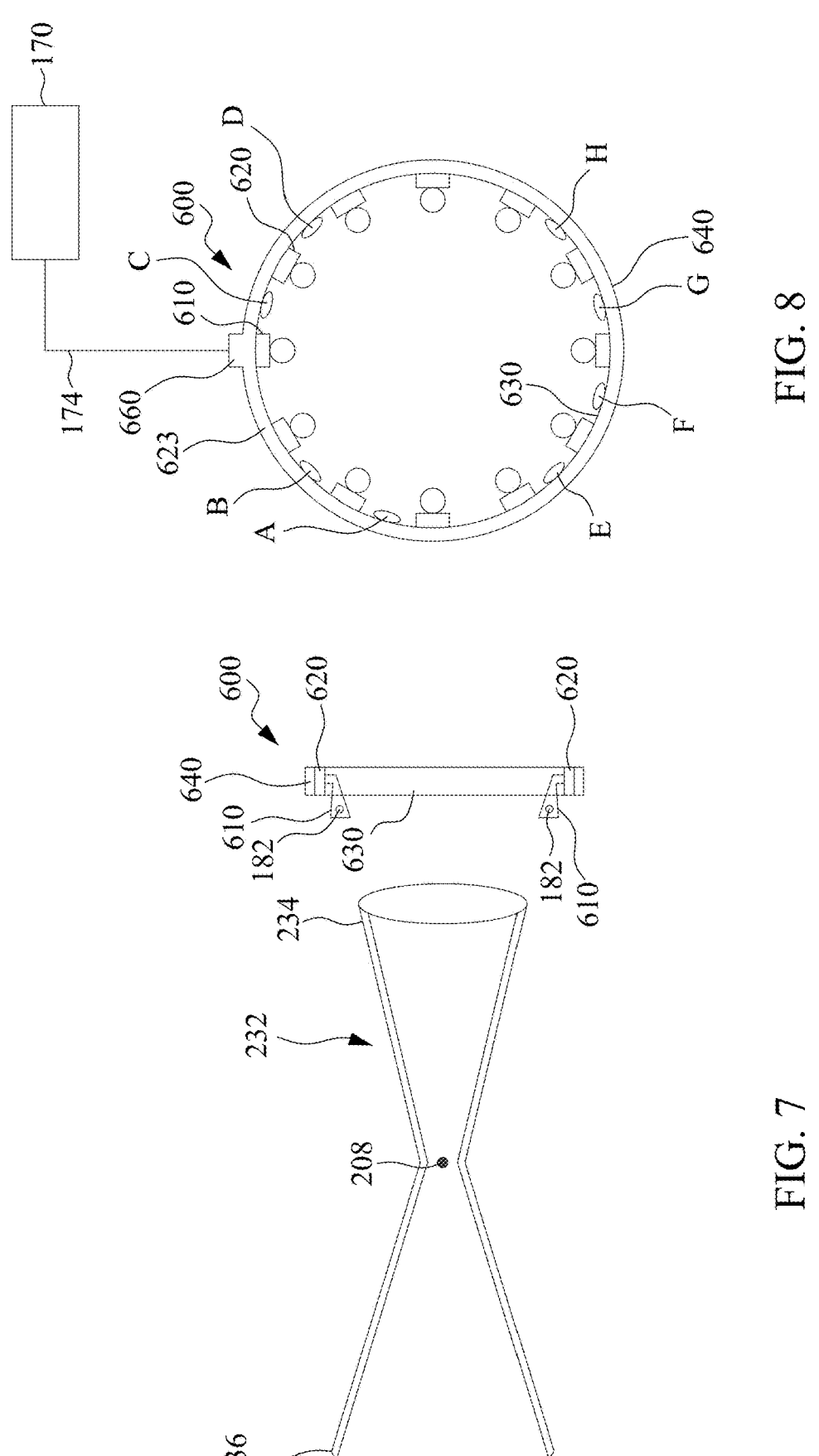
FIG. 7 is a schematic partial view of an extreme ultraviolet light lithography system with the hollow connection member configured with an inlet in the circular configuration according to one or more embodiments of the present disclosure.
FIG. 8 is a front view of the inlet in the circular configuration illustrated in FIG. 7 according to one or more embodiments of the present disclosure.
Figure 9:
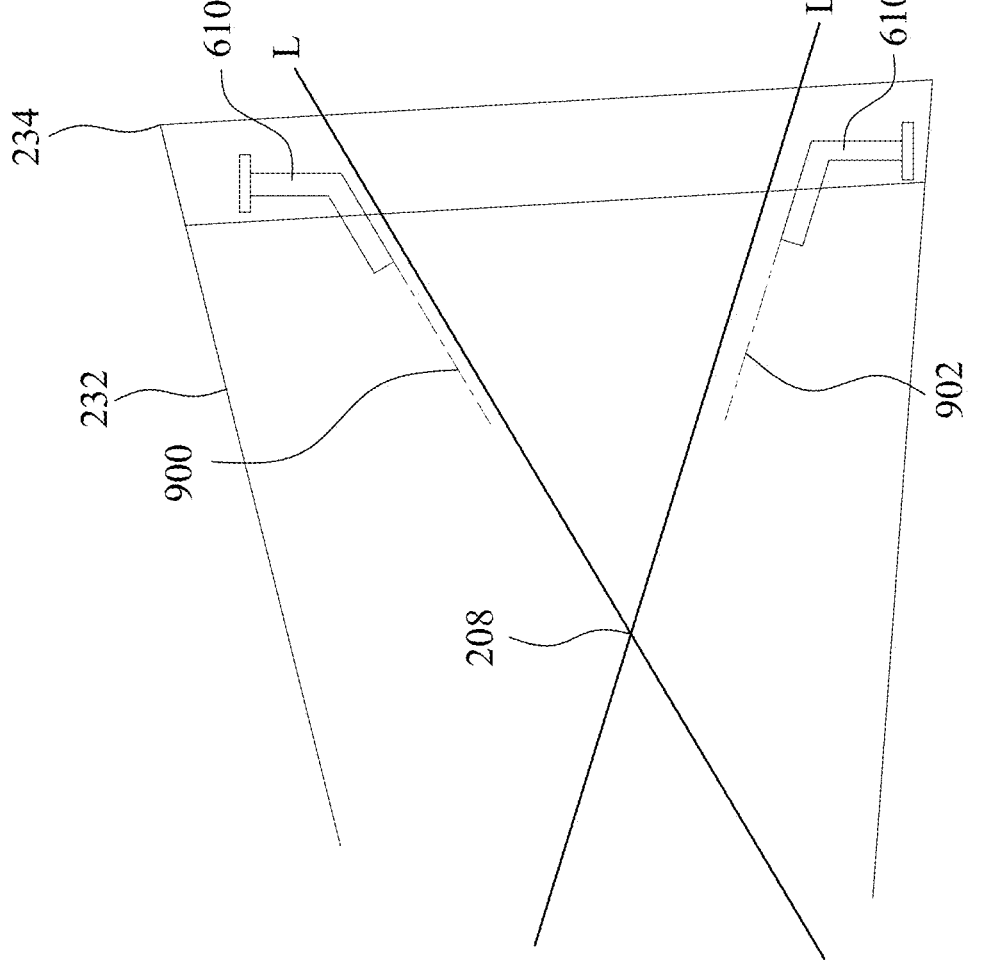
FIG. 9 is a partial side view of the inlet in the circular configuration illustrated in FIG. 7 according to one or more embodiments of the present disclosure.

FIG. 7 is a schematic partial view of an extreme ultraviolet light lithography system 100 with the hollow connection member 232 configured with an alternative embodiment of inlet 500 in FIGS. 3-6. In FIG. 7 an inlet 600 includes a circular configuration according to one or more embodiments of the present disclosure. FIG. 8 is a front view of the inlet 600 having the circular configuration illustrated in FIG. 7 according to one or more embodiments of the present disclosure. FIG. 9 is a partial side view of the inlet 600 having the circular configuration illustrated in FIG. 7 according to one or more embodiments of the present disclosure. Features of the hollow connection member 232 illustrated in FIGS. 7-9 that are the same as features of hollow connection member 232 illustrated in FIGS. 3-6 are identified by the same reference numeral.

Referring to FIGS. 7-9, the inlet 600 includes a plurality of suction arms 610 (e.g., inlet openings in fluid communication with gas line 174 and exhaust pump 170) extending from a circular gas channel member 620. Circular gas channel member 620 is an annular member including an outer wall 640 and an inner wall 630. Sandwiched between the outer wall 640 and the inner wall 630 is a void or plenum 623. Plenum 623 is a chamber that is in fluid communication with the plurality of suction arms 610. Circular gas channel member 620 also includes a coupling member 660 coupling the circular gas channel member 620 to the gas line 174. Plenum 623 is in fluid communication with exhaust pump 170 via gas line 174 and coupling member 660. In the embodiment illustrated in FIG. 9, the circular gas channel member 620 is received in the first end 234 of hollow connection member 232.

In the embodiment illustrated in FIG. 7, the inlet 600 is disposed adjacent to the hollow connection member 232 and in the scanner 300 portion of the extreme ultraviolet light lithography system 100. In some embodiments, the plurality of suction arms 610 is arranged on the inner wall 630 and pass through an opening in the circular gas channel member 620. In this manner, the plurality of suction arms 610 are in fluid communication with the circular gas channel member 620. In some embodiments, the plurality of suction arms 610 are oriented such that their longitudinal axis 900 and 902, respectively, are at an angle that is parallel to the light pattern (L and L') of the EUV from the light source 200.

As illustrated in FIGS. 7-9, in some embodiments, each of the plurality of suction arms 610 is in fluid communication with the exhaust pump 170 via the gas line 174, the coupling member 660, and the circular gas channel member 620 (i.e., the hollow space in the circular portion of the inlet 600. Exhaust pump 170 is configured to flow gas or remove gas (e.g., hydrogen gas) from within hollow connection member 232 through suction arms 610 and, at the same time, remove contaminants (e.g., tin debris) from within hollow connection member 232. In addition, by flowing gas or removing gas through suction arms 610, the flow pattern of the gas adjacent to the portion of the hollow connection member 232 adjacent to the scanner 300 is changed. By changing the flow pattern of the gas, some of the contaminants passing the area adjacent to the portion of the hollow connection member 232 adjacent to the scanner 300 are influenced by the changed flow pattern created by the suction from the suction arms 610 and are diverted (e.g., guided) toward the inner surface of an inner wall of a chamber of the scanner 300 rather continuing toward components in the scanner 300 (e.g., the illuminator, the photomask stage, the projection optics, and the substrate table) where the contaminants may accumulate upon impact.

In various embodiments of the example of FIGS. 7-9, the controller 400 is configured to generate contamination abatement module control signals (e.g., exhaust pump control signals) that vary the operation speed of the exhaust pump 170 which has the effect of varying the gas volume flow rate at the suction arms 610 of the inlet 600. This variation in volume flow rate at the suction arms 610 creates variation in the gas flow patterns that increases the likelihood that contaminants in the portion of the scanner 300 adjacent the hollow connection member 232 are diverted towards an inner surface of an inner wall of the chamber of the scanner 300 rather than continuing toward components in the scanner 300 (e.g., the illuminator, the photomask stage, the projection optics, and the substrate table).

In some embodiments, the controller 400 transmits the exhaust pump control signal to the exhaust pump controller 172 based on the vacuum pressure data collected from the scanner 300. In some embodiments, these exhaust pump control signals cause the exhaust pump 170 to operate under conditions that maintain the scanner 300 at a predetermined pressure while the operation speed of the exhaust pump 170 varies to create the variation in the gas flow patterns at the inlet 600.

As illustrated in FIG. 9, each of the suction arms 610 is configured to capture contaminants traveling from the light source 200 without interfering with transmission of the EUV light from the light source 200. As shown in FIG. 9, each of the suction arms 610 is angled at the end so that their longitudinal axes 900 and 902 are parallel to the EUV light paths L or L'. With such a configuration, the suction arms 610 are able to capture more gas flowing from the light source 200 (e.g., hydrogen gas) along with the contaminants, without interfering with the transmission of EUV light from the light source 200.

In some embodiments of the present disclosure, the suction arms 610 (particularly the suction opening located at each of the end of the suction arms 610) and/or the circular gas channel 620 include the magnet member 182 to deter the contaminants such as tin debris from contaminating the components in the scanner 300 (e.g., the illuminator, the photomask stage, the projection optics, and the substrate table). As discussed above, the magnet member 182 includes one or more of a permanent magnet, an electromagnet driven by the magnet member driver 180, or a permanent magnet and an electromagnet. As described above in FIG. 5 and FIG. 6, by controlling the electromagnet (e.g., transmitting an electromagnet control signal to the magnet member driver 180), by arranging the permanent magnet with different magnetic power, or both, variation in the magnetic field created by the magnet member 182 increases the likelihood of diverting contaminants that are susceptible to a magnetic field to an inner surface of an inner wall of the chamber of the scanner 300 rather than allowing the contaminants to continue toward components in the scanner 300 (e.g., the illuminator, the photomask stage, the projection optics, and the substrate table). For example, electromagnets (A-H) of the magnet member 182 in FIG. 8 can be operated similar to the electromagnets (A-H) of the magnet member 182 in FIG. 6 to increase the likelihood of diverting the contaminants to an inner surface of a wall of the chamber of the scanner 300.

Figure 10:
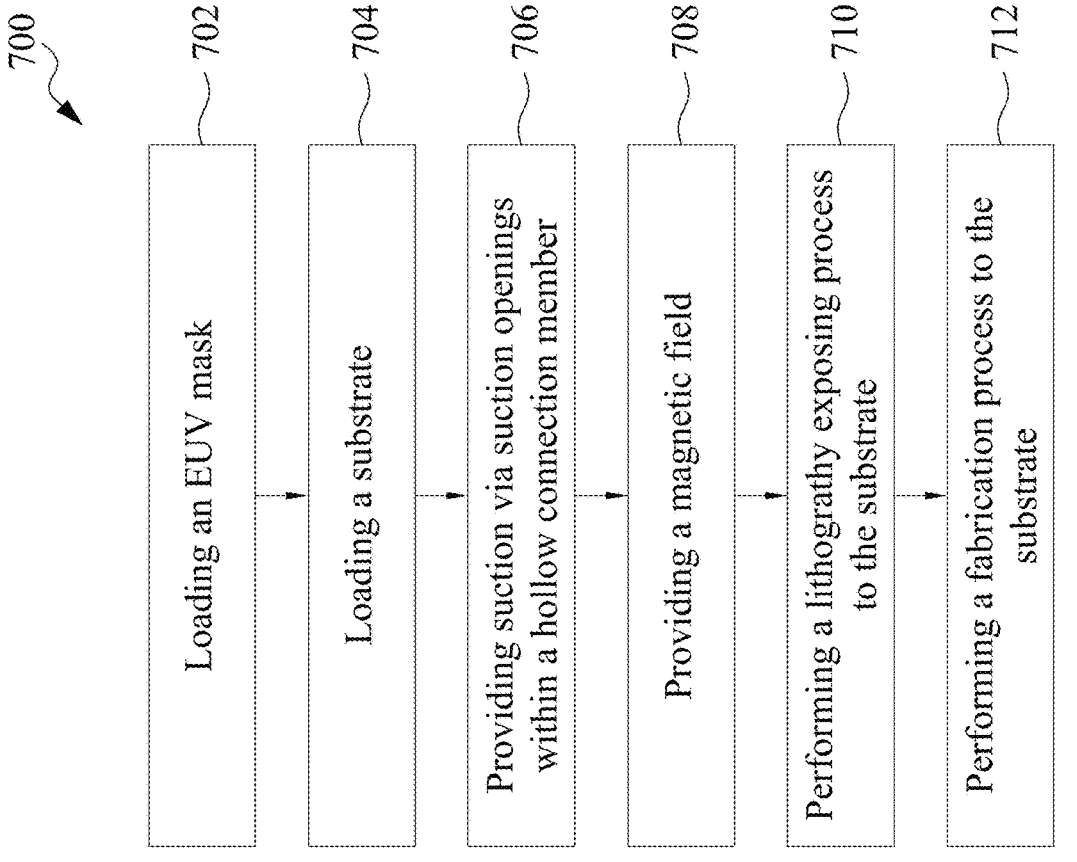
FIG. 10 is a flow chart illustrating a method of a lithography process implemented by the extreme ultraviolet light lithography system including the hollow connection member configured with the inlet according to one or more embodiments of the present disclosure.

FIG. 10 is a flow chart illustrating a method of a lithography process 700 implemented by the extreme ultraviolet light lithography system 100 including the hollow connection member 232 configured with the inlet 500 according to one or more embodiments of the present disclosure.

Method 700 includes an operation 702 by loading an EUV mask, such as mask 330 to the extreme ultraviolet light lithography system 100 that is operable to perform an EUV lithography exposing process. Mask 330 includes an IC pattern to be transferred to a semiconductor substrate, such as the substrate 350. Operation 702 may further include various steps, such as securing the mask 330 on the photomask stage 320 and performing an alignment.

Method 700 includes an operation 704 by loading the substrate 350 to the extreme ultraviolet light lithography system 100. Substrate 350 is coated with an EUV patternable material, e.g., a photoresist layer. In the present embodiment, the photoresist layer is sensitive to the EUV radiation from the light source 100 of the extreme ultraviolet light lithography system 100.

Method 700 includes an operation 706 of providing suction via the inlet 500 (e.g., suction openings 510) within the hollow connection member 232. As discussed above, in some embodiments, the controller 400 is configured to generate the contamination abatement module control signal based on the vacuum pressure data of the scanner 300 to keep the hollow connection member 232 under the higher vacuum condition than the vacuum condition of the scanner 300. In some embodiments, the controller 400 transmits the contamination abatement module control signal (e.g., exhaust pump control signal) based on the vacuum pressure data of the scanner 300 to maintain the hollow connection member 232 under the higher vacuum condition than the vacuum condition in the scanner 300 by a predetermined pressure difference (e.g., 2 Pa). In some embodiments, the controller 400 is configured to vary the predetermined pressure difference (e.g., setting the predetermined pressure from the 2 Pa to 1 Pa and back to 2 Pa) to create variation in the gas flow pattern in the hollow space. The random variation (and/or the periodic variation) in the flow pattern provides a different gas flow pattern that can increase the likelihood of diverting the contaminants to the inner surface of the scanner 300 rather than allowing them to flow towards the components in the scanner 300 (e.g., the illuminator, the photomask stage, the projection optics, and the substrate table).

Method 700 includes an operation 708 of providing a magnetic field, using the magnet member 182, in the hollow connection member 232. As discussed above, in some embodiments, the hollow connection member 232 includes the magnet member 182 to create a (electro) magnetic field to attract the contaminants (e.g., tin debris) into the suction openings 510. Some of the contaminants that are attracted to or influenced by the magnetic field but still remain in the extreme ultraviolet light lithography system 100 (e.g., the hollow connection member 232 and scanner 300) are diverted to the inner surface of the scanner 300 rather than flowing towards surfaces of the components in the scanner 300 (e.g., the illuminator, the photomask stage, the projection optics, and the substrate table). In some embodiments, the suction provided by operation 706 remains through the whole duration of the operation 708.

Method 700 includes an operation 710 of performing a lithography exposing process on the substrate 350 in the extreme ultraviolet light lithography system 100. In the operation 710, the light generator 220 (e.g., carbon dioxide pulse laser generator and excimer laser generator) and the droplet generator 202 are turned on in a synchronized mode (the laser pulse and the droplet generation rate are synchronized) through a suitable mechanism, such as a control circuit (such as controller 400) with a timer to control and synchronize both. In some embodiments, the suction provided by the operation 706 remains in place through the whole duration of the operation 710. In some embodiments, the magnetic field provided by the operation 708 remains in place through the whole duration of the operation 710. In some embodiments, the variation of the operation of the exhaust pump 170 and/or the energizing of the magnet member 182 is synchronized with the operation of the light generator 220 in the droplet generator 202 so as to maximize the removal of contaminants from the extreme ultraviolet light lithography system 100.

During the operation 710, the EUV light generated by the light source 200 is illuminated on the mask 330 (by the illuminator 310), and is further projected on the photoresist layer coated on the substrate 350 (by the projection optics 340), thereby forming a latent image on the photoresist layer. In some embodiments, the lithography exposing process is implemented in a scan mode.

Method 700 may include other operations to complete the lithography process. For example, the method 700 may include an operation 710 of developing the exposed photoresist layer to form a photoresist pattern having a plurality of openings defined thereon. Particularly, after the lithography exposing process at the operation 710, the substrate 350 is transferred out of the extreme ultraviolet light lithography system 100 to a developing unit to perform a developing process to the photoresist layer. Method 700 may further include other operations, such as various baking steps. As one example, the method 700 may include a post-exposure baking (PEB) step between the operations 708 and 710.

Method 700 may further include other operations, such as an operation 712 to perform a fabrication process to the substrate through the openings of the photoresist pattern. In one example, the fabrication process includes an etch process to the wafer using the photoresist pattern as an etch mask. In another example, the fabrication process includes an ion implantation process to the wafer using the photoresist pattern as an implantation mask.

Figure 11:
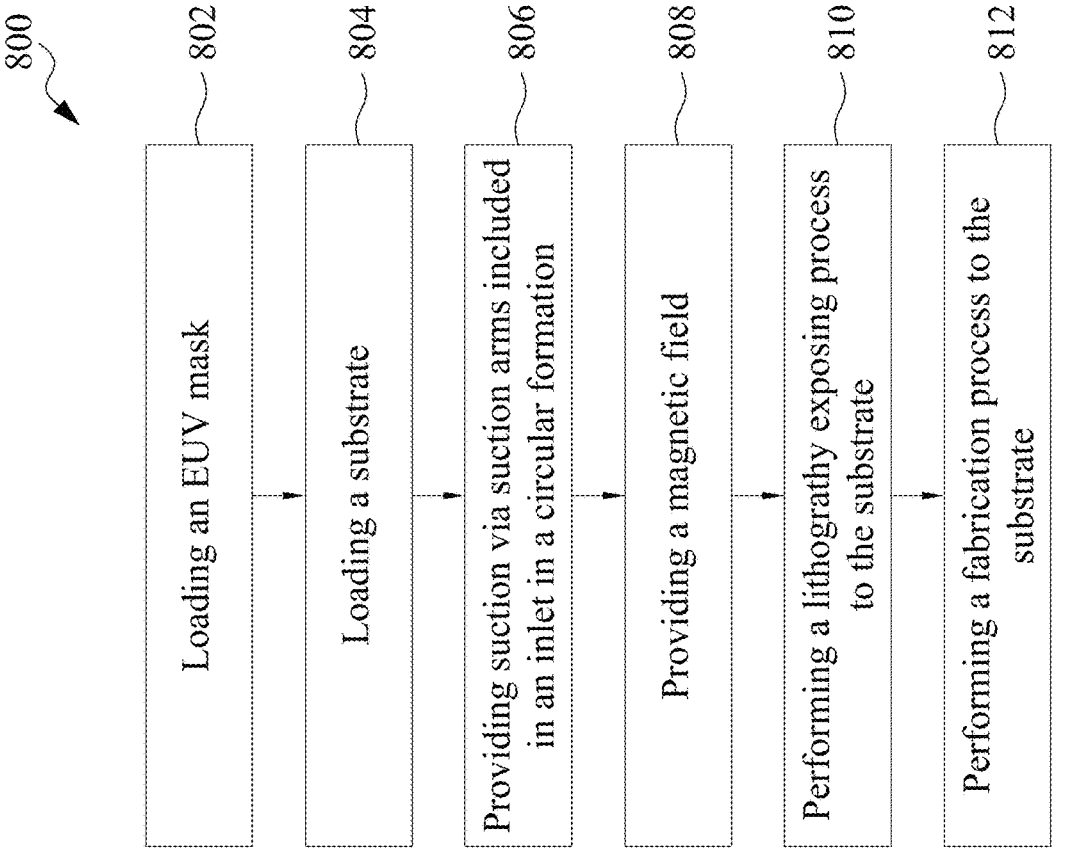
FIG. 11 is a flow chart illustrating a method of a lithography process implemented by the extreme ultraviolet light lithography system configured with the inlet in the circular formation according to one or more embodiments of the present disclosure.

FIG. 11 is a flow chart illustrating a method of a lithography process 800 implemented by the extreme ultraviolet light lithography system 100 configured with the inlet 600 having the circular configuration described with reference to FIGS. 7-9 according to one or more embodiments of the present disclosure.

Method 800 includes an operation 802 of loading an EUV mask, such as mask 330, to the extreme ultraviolet light lithography system 100 that is operable to perform an EUV lithography exposing process. Mask 330 includes an IC pattern to be transferred to a semiconductor substrate, such as the substrate 350. Operation 802 may further include various steps, such as securing the mask 330 on the photomask stage 320 and performing an alignment.

Method 800 includes an operation 804 of loading the substrate 350 to the extreme ultraviolet light lithography system 100. Substrate 350 is coated with a photoresist layer. In the present embodiment, the photoresist layer is sensitive to the EUV radiation from the light source 100 of the extreme ultraviolet light lithography system 100.

Method 800 includes an operation 806 of providing suction via the suction arms 610 included in the inlet 600. As discussed above, in some embodiments, each of the suction arms 610 is connected to the exhaust pump 170 via the circular gas channel 620 arranged within the inlet 600 and the gas line 174. Each of the suction arms 610 of the inlet is connected to the exhaust pump 170 that is configured to remove the air or gas (e.g., hydrogen gas) along with contaminants (e.g., tin debris) and/or change the flow pattern of the gas adjacent to the portion of the hollow connection member 232 adjacent to the scanner 300. By changing the flow pattern of the gas, some of the contaminants passing the area adjacent to the portion of the hollow connection member 232 are influenced by the flow pattern created by the suction from the suction arms 610 and are diverted towards an inner surface of a wall of the chamber of the scanner 300 rather than flowing towards surfaces of the components in the scanner 300 (e.g., the illuminator, the photomask stage, the projection optics, and the substrate table).

Method 800 includes an operation 808 of providing a (electro) magnetic field, using the magnet member 182, in the inlet 600. As discussed above, in some embodiments, the inlet 600 includes the magnet member 182 which can be energized to create a (electro) magnetic field to attract contaminants (e.g., tin debris) into the suction arms 610 (e.g., inlet of the suction arms 610) or to change the path of contaminants that are flowing towards various components in the scanner 300. Some of the contaminants that are attracted to or influenced by the magnetic field but still remain in the extreme ultraviolet light lithography system 100 (e.g., scanner 300) are diverted to the inner surface of a wall of the chamber of the scanner 300 rather continuing on toward components in the scanner 300 (e.g., the illuminator, the photomask stage, the projection optics, and the substrate table).

Method 800 includes an operation 810 of performing a lithography exposing process to the substrate 350 in the extreme ultraviolet light lithography system 100. In the operation 810, the light generator 220 (e.g., carbon dioxide pulse laser generator and excimer laser generator) and the droplet generator 202 are turned on in a synchronized mode (the laser pulse and the droplet generation rate are synchronized) through a suitable mechanism, such as a control circuit (such as controller 400) with a timer to control and synchronize both. In some embodiments, the suction provided by the operation 806 remains in place through the whole duration of the operation 810. In some embodiments, the magnetic field provided by the operation 808 remains in place through the whole duration of the operation 810. In some embodiments, the variation of the operation of the exhaust pump 170 and/or the energizing of the magnet member 182 is synchronized with the operation of the light generator 220 in the droplet generator 202 so as to maximize the removal of contaminants from the extreme ultraviolet light lithography system 100.

During the operation 810, the EUV light generated by the light source 200 is illuminated on the mask 330 (by the illuminator 310), and is further projected on the photoresist layer coated on the substrate 350 (by the projection optics 340), thereby forming a latent image on the photoresist layer. In some embodiments, the lithography exposing process is implemented in a scan mode.

Method 800 may include other operations to complete the lithography process. For example, the method 800 may include an operation 810 of developing the exposed photoresist layer to form a photoresist pattern having a plurality of openings defined thereon. Particularly, after the lithography exposing process at the operation 810, the substrate 350 is transferred out of the extreme ultraviolet light lithography system 100 to a developing unit to perform a developing process to the photoresist layer. Method 800 may further include other operations, such as various baking steps. As one example, the method 800 may include a post-exposure baking (PEB) step between the operations 808 and 810.

Method 800 may further include other operations, such as an operation 812 to perform a fabrication process to the substrate through the openings of the photoresist pattern. In one example, the fabrication process includes an etch process to the wafer using the photoresist pattern as an etch mask. In another example, the fabrication process includes an ion implantation process to the wafer using the photoresist pattern as an implantation mask.

Utilizing contamination abatement module 160 that is able to reduce volume of contaminants that impinge and accumulate on components of the scanner 300, such as the tin debris entering into the scanner 300, will produce a substantial fabrication cost savings due to reduced defects in the exposure step.

Utilizing contamination abatement module 160 that is able to reduce the volume of contaminants that impinge and accumulate on components of the scanner 300, such as the tin debris entering into the scanner 300, will extend the cleaning interval (e.g., preventive maintenance interval) of various components in the scanner 300.

Utilizing contamination abatement module 160 that is able to reduce the contaminants that impinge and accumulate on components of the scanner 300, such as the tin debris entering into the scanner 300, will improve or maintain the intensity of the extreme ultraviolet light provided to the scanner 300 of the extreme ultraviolet light lithography system 100. By maintaining the intensity of the extreme ultraviolet light provided to the scanner 300, the quality of the patterns produced in the photoresist will be maintained within process tolerances.

According to one or more embodiments of the present disclosure, a lithography system is provided capable of deterring the contaminants such as tin debris from entering into a scanner of the lithography system. The lithography system in accordance with various embodiments of the present disclosure includes a processor, an extreme ultraviolet light source, a scanner, and a hollow connection member. The extreme ultraviolet light source includes a droplet generator for generating a droplet, a collector for reflecting extreme ultraviolet light into an intermediate focus point, and a light generator for generating pre-pulse light and main pulse light, wherein the droplet generates the extreme ultraviolet light in response to the droplet being illuminated with the pre-pulse light and the main pulse light. The scanner includes a mask stage and a substrate table. The hollow connection member includes an inlet in fluid communication with an exhaust pump. The hollow connection member includes a hollow space in which the intermediate focus point is disposed. The hollow connection member is disposed between the extreme ultraviolet light source and the scanner.

According to one or more embodiments of the present disclosure, a method of generating extreme ultraviolet light for a semiconductor fabrication process includes determining, by a processor, an operation parameter of an exhaust pump. The determining the operation parameter of the exhaust pump includes measuring vacuum pressure in a scanner of a lithography system and determining a speed at which to operate the exhaust pump based on the vacuum pressure in the scanner. The pump is in fluid communication with a hollow connection member between the scanner and a light source of the lithography system.

According to one or more embodiments of the present disclosure, a method of generating extreme ultraviolet light for a semiconductor fabrication process includes loading the mask in an extreme ultraviolet light lithography system, operating the exhaust pump, and exposing the mask to extreme ultraviolet light from the extreme ultraviolet light source. The extreme ultraviolet light lithography system includes a processor, an extreme ultraviolet light source, a scanner, and a hollow connection member. The extreme ultraviolet light source includes a droplet generator for generating a droplet, a collector for reflecting extreme ultraviolet light into an intermediate focus point, and a light generator. The scanner includes a mask stage configured to secure the mask and a substrate table configured to secure a substrate. The hollow connection member is located between the extreme ultraviolet light source and the scanner. The hollow connection member includes an inlet that is in fluid communication with an exhaust pump. The hollow connection member has a hollow space in which the intermediate focus point is disposed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An extreme ultraviolet light lithography system, comprising:
   a processor;
   an extreme ultraviolet light source including:
      a droplet generator configured to generate a droplet;
      a collector configured to reflect extreme ultraviolet light into an intermediate focus point; and
      a light generator configured to generate pre-pulse light and main pulse light, wherein the droplet generator generates the extreme ultraviolet light in response to the droplet being illuminated with the pre-pulse light and the main pulse light;
   a scanner including:
      a mask stage; and
      a substrate table;
   a hollow connection member including a first end and a second end opposite the first end, the hollow connection member is between the extreme ultraviolet light source and the scanner, and wherein the hollow connection member includes a first hollow space in which the intermediate focus point is disposed; and
   a gas channel member that is annular and received by the second end of the hollow connection member, the gas channel member includes an inner wall, an outer wall, and a plurality of suction arms that extend inward from the inner wall and extend away from the outer wall, the plurality of suction arms are in fluid communication with an exhaust pump through a gas channel of the gas channel member between and delimited by the inner wall and the outer wall of the gas channel member, and wherein the gas channel member includes a second hollow space into which the plurality of suction arms extend from the inner wall.

2. The extreme ultraviolet light lithography system of claim 1, further comprising one or more permanent magnets on one or more of the plurality of suction arms.

3. The extreme ultraviolet light lithography system of claim 1, further comprising one or more electromagnets at and along an inner surface of the hollow connection member.

4. The extreme ultraviolet light lithography system of claim 3, wherein the one or more electromagnets are between pairs of adjacent ones of the plurality of suction arms.

5. The extreme ultraviolet light lithography system of claim 1, wherein each of the plurality of suction arms are oriented such that their respective longitudinal axes are parallel to a light pattern passing through the hollow connection member and the gas channel member.

6. The extreme ultraviolet light lithography system of claim 1, further comprising:
a plurality of permanent magnet members, each respective permanent magnet member of the plurality of permanent magnet members is on a corresponding suction arm of the plurality of suction arms; and
a plurality of electromagnets, each respective electromagnet of the plurality of electromagnets is between respective adjacent pairs of the plurality of suctions arms.

7. The extreme ultraviolet light lithography system of claim 6, wherein each respective electromagnet of the plurality of electromagnets is at and along an inner surface of the hollow connection member.

8. The extreme ultraviolet light lithography system of claim 6, wherein the plurality of permanent magnet members and the plurality of electromagnets are configured to, in operation, divert contaminants toward an inner surface of the hollow connection member to prevent the contaminants from reaching the scanner.

9. The extreme ultraviolet light lithography system of claim 1, wherein the processor is configured to, in operation, determine an operation speed of the exhaust pump based on a pressure in the scanner.

10. The extreme ultraviolet light lithography system of claim 9, wherein the processor is configured to, in operation, control the exhaust pump to create a lower pressure condition in the hollow connection member than a pressure in the scanner.

11. The extreme ultraviolet light lithography system of claim 1, wherein the plurality of suction arms are configured to, in operation, remove contaminants from the first hollow space to prevent the contaminants from reaching the scanner.

12. A device, comprising:
a gas channel portion that is annular and configured to, in operation, be received by a respective end of a hollow connection member having a first hollow space, wherein the gas channel portion includes:

an inner wall having an inner surface;
an outer wall opposite to the inner wall;
a second hollow space delimited by the inner surface of the inner wall; and
a gas channel that extends through the gas channel portion and is delimited by the inner wall and the outer wall; and
a plurality of suction arms coupled to the gas channel portion, the plurality of suction arms extend inward from the inner surface of the inner wall and extend away from the outer wall, the plurality of suction arms are in fluid communication with the gas channel of the gas channel portion.

13. The device of claim 12, wherein each of the plurality of suction arms are oriented such that their respective longitudinal axes are parallel to a light pattern passing through the first hollow space of the hollow connection member and the second hollow space of the gas channel portion.

14. The device of claim 12, further comprising one or more permanent magnets on one or more of the plurality of suction arms.

15. The device of claim 12, further comprising one or more electromagnets at and along an inner surface of the hollow connection member.

16. The device of claim 15, wherein the one or more electromagnets are between pairs of adjacent ones of the plurality of suction arms.

17. The device of claim 12, wherein the plurality of suction arms are configured to, in operation, remove contaminants from the first hollow space of the hollow connection member.

18. A method of exposing a mask to an extreme ultraviolet light in a semiconductor fabrication process, the method comprising:
drawing contaminants within a hollow connection member towards an inlet by utilizing an exhaust pump, the inlet including a plurality of suction arms along an inner wall of the hollow connection member, the plurality of suction arms extend inward from the inner wall towards an intermediate focus point positioned within the hollow connection member, and the plurality of suction arms are in fluid communication with the exhaust pump through a gas channel present between the inner wall and an outer wall of the hollow connection member.

19. The method of claim 18, further comprising operating the exhaust pump to draw contaminants towards the inlet of the hollow connection member including the plurality of suction arms.

20. The method of claim 18, further comprising supplying current to an electromagnet associated with the hollow connection member to generate a magnetic field to deflect contaminants that are passing through the magnetic field.

* * * * *